(12) United States Patent
Betz et al.

(10) Patent No.: US 7,635,612 B2
(45) Date of Patent: Dec. 22, 2009

(54) METHOD AND USE OF A DEVICE FOR APPLYING COATINGS TO BAND-LIKE STRUCTURES DURING THE PRODUCTION OF SEMICONDUCTOR COMPONENTS

(75) Inventors: Bernd Betz, Obertraubling/Oberhinkofen (DE); Joachim Mahler, Regenburg (DE); Ralf Otremba, Kaufbeuren (DE); Stefan Paulus, Zeitlarn (DE)

(73) Assignee: Infineon Technologies AG, Munich (DE)

( * ) Notice: Subject to any disclaimer, the term of this patent is extended or adjusted under 35 U.S.C. 154(b) by 474 days.

(21) Appl. No.: 11/549,366

(22) Filed: Oct. 13, 2006

(65) Prior Publication Data
US 2007/0128371 A1 Jun. 7, 2007

Related U.S. Application Data

(63) Continuation of application No. PCT/DE2005/000639, filed on Apr. 13, 2005.

(30) Foreign Application Priority Data
Apr. 14, 2004 (DE) .................. 10 2004 018 483

(51) Int. Cl.
*H01L 21/56* (2006.01)
(52) U.S. Cl. ............... 438/118; 438/126; 438/782; 257/E21.502
(58) Field of Classification Search .............. 438/782
See application file for complete search history.

(56) References Cited

U.S. PATENT DOCUMENTS 3,915,780 A  10/1975  Broussard, Jr. et al. ...... 156/244
5,976,955 A * 11/1999  Hodges ................... 438/464
6,110,537 A   8/2000  Heffner et al.
2002/0066966 A1  6/2002  Farnworth

FOREIGN PATENT DOCUMENTS

| DE | 3941318 A1 | 6/1990 |
| DE | 69707204 | 5/2002 |
| EP | 1017226 | 7/2000 |
| WO | 0074131 | 12/2000 |
| WO | 03023878 | 3/2003 |

OTHER PUBLICATIONS

International Preliminary Search Report, PCT/DE2005/000639, 8 pgs, mailing date Nov. 9, 2006.
Examination Report for DE 10 2004 018 483.6-33 dated Feb. 21, 2005 issued by the German Patent Office.

* cited by examiner

*Primary Examiner*—Stephen W Smoot
(74) *Attorney, Agent, or Firm*—Banner & Witcoff, Ltd

(57) ABSTRACT

In a device (35) and a method a thin organic or inorganic layer is applied to individual component positions of band-like structures (1). The layer can effect improved or optimized adhesion between a coated surface and a plastic housing compound. Furthermore, the layer can be used as a corrosion prevention layer, an electrical insulating layer or as a dielectric for the coated surfaces. For the selective application of the layer, the device (35) has a jet printer (2) having a plurality of electronically controllable jet heads (4-7). The jet printer (2) coats the band-like structures (1) selectively on the upper side (17) in a first coating position (15) and coats the band-like structures (1) selectively on the underside (18) in a second coating position (16).

17 Claims, 2 Drawing Sheets

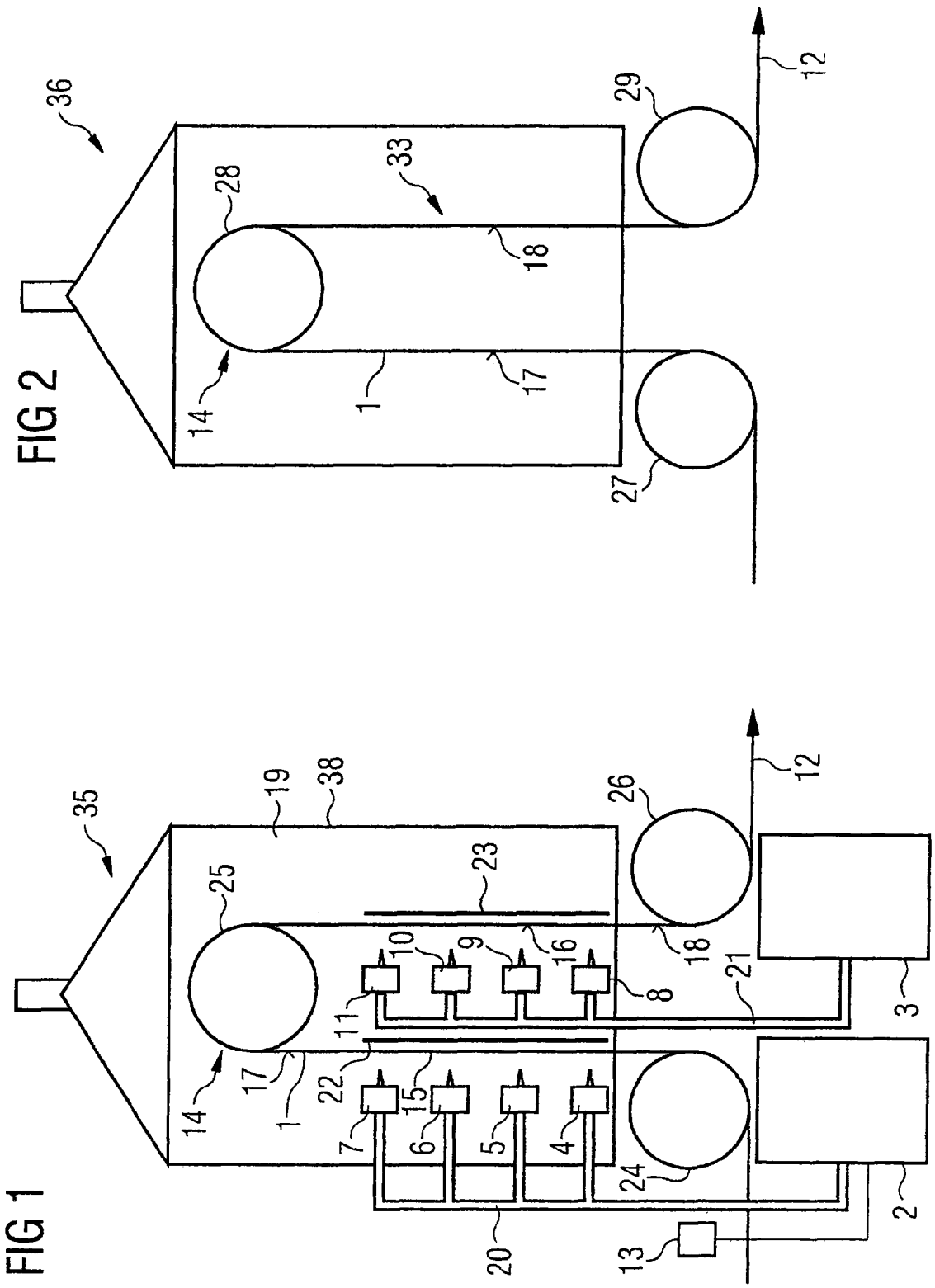

METHOD AND USE OF A DEVICE FOR APPLYING COATINGS TO BAND-LIKE STRUCTURES DURING THE PRODUCTION OF SEMICONDUCTOR COMPONENTS

CROSS-REFERENCE TO RELATED APPLICATION

This application is a continuation of co-pending International Application No. PCT/DE2005/000639 filed Apr. 13, 2005, which designates the United States, and claims priority to German application number DE 10 2004 018 483.6 filed Apr. 14, 2004.

TECHNICAL FIELD

The invention relates to a method for applying coatings to band-like structures during the production of semiconductor components, these band-like structures having periodically repeating component positions which are to be coated selectively. Selective coating means that the component positions are to be provided with a layer only at envisaged points.

BACKGROUND

Providing envisaged points with a coating of organic material can be of particular importance in the semiconductor industry. For example, all the surfaces of a structure or a component position which, in what is known as a "molding process", are to be covered with a plastic compound forming a housing can be provided with an adhesion-promoting layer. The remaining surfaces, for example the surfaces of external flat conductors, are to be kept free from this coating and from the plastic compound, however, in order to permit external electrical connection of the semiconductor component.

These known methods provide firstly for the surfaces that are not to be coated or are to be kept free, for example of a leadframe or a blank, to be provided selectively with a protective layer. The selective application of protective layers is time-consuming and expensive. The adhesion-promoting coating can then be applied over a large area, which likewise gives rise to additional costs, since a considerable proportion of expensive coating material is applied and then has to be removed again with the protective layer, so that an adhesion-improving layer remains only on the regions not covered by the protective layer.

SUMMARY

A method for applying a coating to a circuit carrier, the method may comprise the steps of providing a band-like structure, which has a plurality of periodically repeating component positions, each component position comprising a circuit carrier for a semiconductor component; introducing the band-like structure to be coated into a first coating position; and simultaneous selective coating by means of a jet printing process on the repeating component positions on at least one upper side of the band-like structure with a coating.

BRIEF DESCRIPTION OF THE DRAWINGS

The invention will now be explained in more detail by using the appended figures.

FIG. 1 shows a basic sketch of a device for the selective coating of band-like structures with a coating material such as an adhesion promoter;

FIG. 2 shows a basic sketch of a device for drying or curing the coating solution;

DETAILED DESCRIPTION

Figure 3:
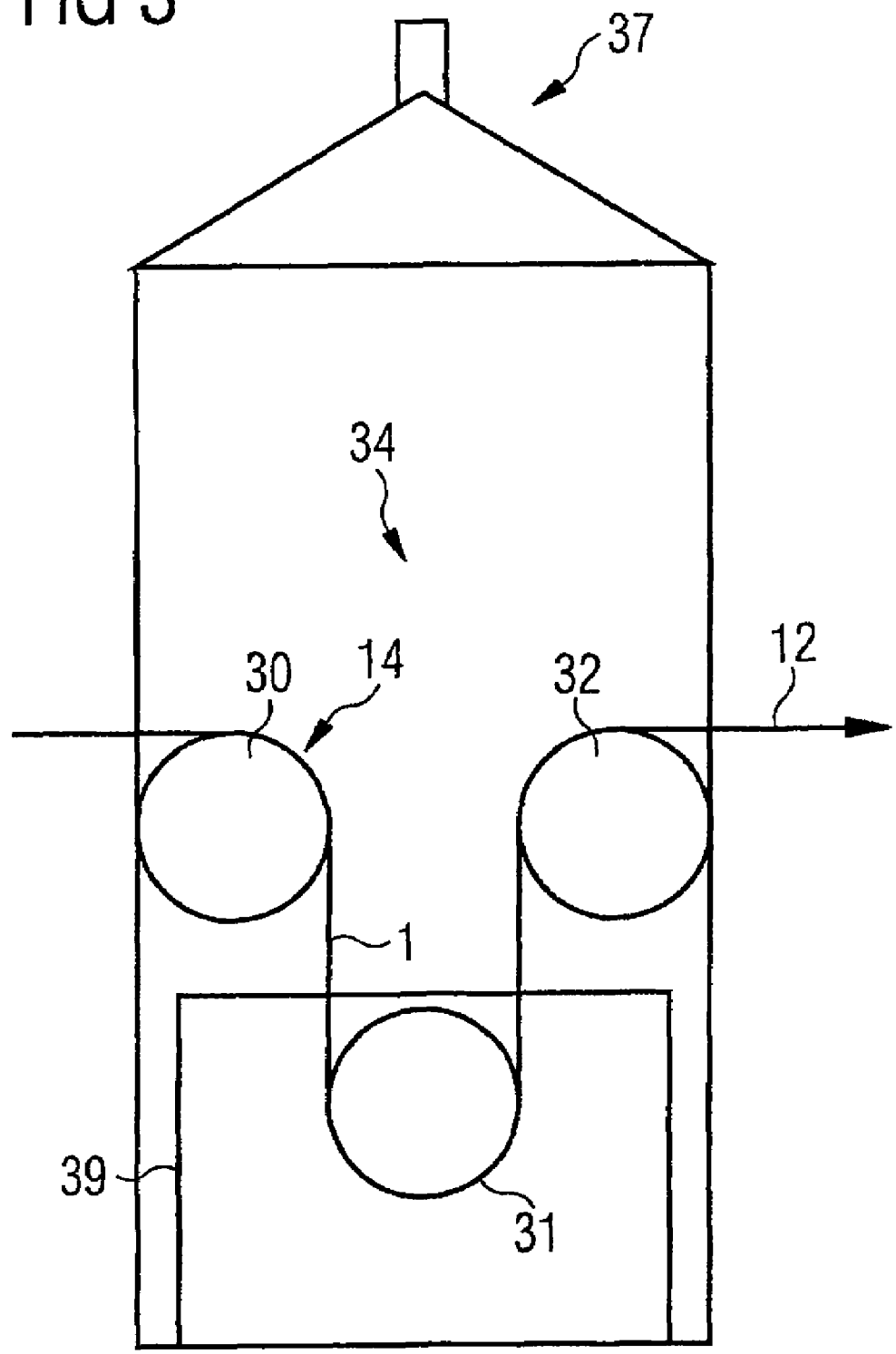
FIG. 3 shows a basic sketch relating to cleaning the band-like structures.

According to an embodiment, a jet printing device can be used for the selective coating of a circuit carrier with a coating. A band-like structure having a plurality of periodically repeating component positions is provided. Each component position has a circuit carrier for a semiconductor component. The circuit carrier can have a leadframe or a rewiring substrate. The jet printing device is used for selective application of a coating to at least an upper side of the individual component positions of the band-like structure.

The periodically repeating component positions can be coated selectively with an adhesion-promoting layer or a corrosion prevention layer or an electrical insulating layer. The coating can have organic or inorganic material or a metal or can consist of a mixture of these materials.

The device may comprise at least one jet printer which has one or more electronically controllable jet heads. A control unit is used to align the jet heads with the component positions to be coated or, vice versa, to align the component positions with the jet heads to be coated. The device can have one coating position or two separate coating positions. A guide mechanism of the device has two separate coating positions for an upper side and an underside of the band-like structures.

The use of this device, which operates with a jet printer, has the advantage that application is made selectively only to the areas of the circuit carrier which come into contact with a plastic compound later, for example in a "molding process". Furthermore, the device has the advantage that, on the basis of a plurality of electronically controllable jet heads, the periodically repeating component positions on the band-like structure can be coated simultaneously in a single coating position with the coating material such as an adhesion promoter. Using this jet printer of the device, not only is it possible to save coating material but the expenditure of time for a selective application of coating material is also shortened, particularly since no protective layers have to be applied to the surfaces to be protected against the coating material. Furthermore, the consumption of coating material is minimized by this jet printer of the device, since coating material is applied only at the points from the component positions which are to be coated selectively with coating material.

In an embodiment, the device has a dust-free region in which the coating positions are arranged. Dust-free or low-dust regions of this type are provided with the aid of appropriate increases in pressure with filtered air, in order to increase the reliability of the device during the coating operation, since even the smallest dust particle can give rise to defective coating.

In a further preferred embodiment, the device has separately controllable jet printers with corresponding jet heads for the first and the second position. The throughput can advantageously be increased therewith, since the locally offset coating positions for the upper side and the underside are provided in the device. With the two separately controllable jet printers, it is nevertheless possible simultaneously both to apply a coating to the upper side and to apply a coating to the underside in one coating step.

The jet printers have storage containers, in which coating material for a jet printing application can be prepared. In addition, the device has feed lines to the jet heads, via which the jet heads are supplied with coating material, preferably an adhesion promoter. In each case at least one feed line is provided for each of the coating positions.

Furthermore, in the device protective screens are provided between the coating positions and are intended to ensure that the coating material cannot be propagated in an uncontrolled manner in the coating positions or in the dust-free region.

The control unit can have an image recognition and image evaluation unit, in order to ensure and optically monitor printing of the component positions of the band-like structure with the coating material in a selective and specific manner. To this end, the coating solution suitable for a jet print can have colored pigments which, in particular in the case of fluorescent colored particles, ensure a high detection rate.

In a further preferred embodiment, the guide mechanism has deflection drums which ensure that, from the entry to the first coating position for the upper side and during the transition to the second coating position for the underside, the band-like structures to be coated in each case experience a deflection, and the component positions to be coated selectively are freely accessible. Instead of the guide mechanism on the basis of deflection drums, U-shaped guide rails can also be provided, in which the side edge regions of the band-like structures are guided. U-shaped rails of this type have the advantage that the band-like structures are contacted only in their side edge regions, while the areas to be coated remain freely accessible. This can also be achieved by means of appropriate shaping of the deflection drums or by using disk-like guides in the edge regions of the drum, over which the band-like structures then roll in their side edge regions.

A method for applying a thin coating of a few nm to several μm layer thickness, preferably 2 nanometers to 50 micrometers, to a circuit carrier has the following method steps. Firstly, a band-like structure is provided which has a plurality of periodically repeating component positions. Each component position has a circuit carrier for a semiconductor component.

The band-like structure is introduced into a first coating position and then simultaneous selective coating by means of a jet printing operation to a plurality of periodically repeating component positions on at least an upper side of the band-like structure is carried out with a coating material.

In order to coat the underside of the circuit carrier, the band-like structure to be coated can be transported into a second coating position and, in this second coating position, selective coating by means of a jet printing operation of a plurality of periodically repeating component positions on the underside of the band-like structure is carried out with a coating material, preferably an adhesion promoter. The band-like structure selectively coated on both sides with the coating material is subsequently moved out of the second coating position.

This method has the fundamental advantage as compared with the previous methods that coating material is only applied where it is needed, for example for a corresponding "molding process". This means that a considerable proportion of coating material, for example adhesion promoter, can be saved. Furthermore, the otherwise normal expenditure of time for applying protective layers to regions of the band-like structures that are not to be coated and with which electrical contact is to be made later is saved completely, since such protective layers are no longer required. This jet coating also makes it possible to reach side regions of the structure if the jet heads are constructed and aligned appropriately.

Furthermore, following the coating, a drying phase can follow, after the band-like structure has been transported into an appropriate drying device. Cleaning steps can also be carried out in further additional positions of the device, if appropriate cleaning and solvent baths are provided in an appropriate position. Although the freedom from dust is not as critical in these following positions as in the coating positions, it may be of interest for the subsequent "molding process" to maintain an increased freedom from dust during drying and cleaning here as well.

The periodically repeating component positions are coated selectively with the coating material by an image detection unit acquiring the component positions spatially and an image evaluation unit controlling the jet heads via a control unit in such a way that only those areas of the component positions which are subsequently to be embedded in or covered with a plastic compound are jet-printed with an adhesion-improving material. The detectability of the selective coating can be improved by mixing organic doping substances or colored and/or fluorescent pigments and/or organic dyes.

In summary, it is to be recorded that a specific application to a defined region or an application of a defined coating is even possible after a bonding wire process. Therefore, for example, the interface adhesion of all the components of a band-like structure to a surrounding plastic compound can be ensured. In this case, the components from an extremely wide range of materials, such as a leadframe made of metal, a chip with integrated circuit of semiconductor material, and a large number of bonding wires or flipchip contacts made of different metals are to be embedded in a plastic compound.

As opposed to the non-specific application of a coating by the known methods by means of spraying or dipping technology, the jet printing according to an embodiment achieves a situation in which the coating, such as an adhesion promoter, is not applied to undesired regions, for example to a leadframe. To this end, according to an embodiment, the known inkjet printing technology is modified for the application of coating material, such as an adhesion-promoting solution, in addition optical process control additionally becoming possible as a result of treating the coating solution with a dye.

By means of the jet printer, the areas of the front side, for example of a leadframe, can now be printed, shielding taking care of uncontrolled contamination of the coating position. The rear of the lead frame, for example, as a band-like structure can then be printed with a second jet printer and its jet heads in a second coating position.

The entire coating installation comprising two coating positions and a plurality of jet printing heads for each of the coating positions is accommodated in a housing, which is kept free of dust by a slight positive pressure. The control of the system is carried out via a controller which, at the same time, is connected to the detection systems. A drying process with heater and a washing process can be provided downstream. The installation can be configured both for bands having individual component positions and for sixfold leadframes or strips.

FIG. 1 shows a basic sketch of a device 35 for the selective coating of band-like structures 1 with a coating material.

The band-like structure has a plurality of periodically repeating component positions. Each component position has a circuit carrier for a semiconductor component. The circuit carrier can have a leadframe or a rewiring substrate.

The device 35 has two coating positions 15 and 16. In the first coating position 15, the upper side 17 of the band-like structure 1 is coated selectively with an organic coating material with the aid of jet heads 4, 5, 6 and 7.

The selectively printed layer can effect improved or optimized adhesion between the coated surfaces of the circuit carrier and a plastic housing compound. Furthermore, the layer can be used as a corrosion prevention layer, as an electrical insulating layer or as a dielectric for the coated surfaces.

This coating material can be colored, so that, via the control unit 13, which has a detection unit, it is possible to follow accurately the extent to which the jet heads 4, 5, 6 and 7 have coated the individual periodically repeating component positions of the band-like structures 1 of the first coating position 15 on their upper side 17. A deflection drum 24 at the entry to the device 35 brings the band-like structure 1 with its upper side 17 into a position opposite the jet heads 4-7. The jet heads 4-7 are supplied with coating solution from the jet printer 2 via the feed line 20. Protective screens 22 and 23 shield off the regions of the coating positions 15 and 16.

The coating positions 15 and 16 are accommodated under a common covering hood 38, which defines a dust-free region 19. In order to keep this region 19 dust-free, filtered air is supplied, in order that the dust-free region 19 can be kept under a slight positive pressure as compared with the surroundings. The device 35 also has a second deflection drum 25, over which the band-like structure 1 is deflected, in order to make it possible for the underside 18 of the band-like structure 1 to be coated in a second coating position 16. To this end, the second coating position 16 has a second jet printer 3, which supplies jet heads 8, 9, 10 and 11 with coating solution via a feed line 21. The coating material is then forced out of the nozzles of the jet heads 8, 9, 10 and 11 onto the periodically repeating component positions of the band-like structure 1.

A further deflection drum 26 at the exit from the device 35 ensures that the band-like structure 1 can be moved into a next position in the transport direction 12. The guide mechanism 14 for guiding the band-like structure 1 in this embodiment, as FIG. 1 shows, thus comprises three deflection drums 24-26. Using such a coating device 35, it is possible to print the band-like structures 1 precisely with a coating at the points at which a plastic compound is later applied and which are intended to interlock with the plastic compound.

FIG. 2 shows a basic sketch of a device 36 for drying or curing the coating solution. In this embodiment, the device 36 likewise has three deflection rollers 27, 28 and 29, over which the band-like structure is led through the position 33 for the purpose of drying. The drying position 33 can be heated by a heater, which is not shown, and kept at a curing temperature for the coating.

FIG. 3 shows a basic sketch of a device 37 for cleaning the band-like structures 1 in a cleaning position 34. In this case, too, three deflection drums 30, 31 and 32 are provided, a deflection drum 30 at the entry, a deflection drum 31 in a cleaning bath 39 and a deflection drum 32 at the exit from the cleaning device 37, in order to transport the band-like structure 1 onward in the transport direction 12. Such a cleaning bath 39 can be advantageous if, for example, during the drying phase, the upper sides of the components that have remained free of the coating become tarnished. Such a thin tarnish layer can be removed with the aid of the cleaning bath 39 of the device 37 without the applied coating on both sides of the band-like structure being attacked.

What is claimed is:

1. A method for applying a coating to a circuit carrier, the method comprising:
    providing a band-like structure, which has a plurality of periodically repeating component positions, each component position comprising a circuit carrier for a semiconductor component;
    introducing the band-like structure to be coated into a first coating position; and
    performing simultaneous selective coating by means of a jet printing process on the repeating component positions on at least one upper side of the band-like structure with a coating.

2. The method according to claim 1, wherein performing selective coating comprises selectively coating the periodically repeating component positions with a layer by an image recognition unit acquiring the arrangement of the component positions spatially and an image evaluation unit controlling jet heads via a control unit in such a way that only those areas of the component positions which are subsequently to be embedded in or covered by a plastic compound are jet-printed with the coating.

3. The method according to claim 1, wherein performing selective coating comprises selectively coating the periodically repeating component positions with an adhesion-promoting layer or a corrosion prevention layer or an electrical insulating layer.

4. The method according to claim 1, further comprising transporting the coated band-like structure into an additional position, and drying the coated band-like structure at the additional position.

5. The method according to claim 1, further comprising transporting the coated band-like structure into an additional position, and cleaning the coated band-like structure at the additional position.

6. The method according to claim 1, wherein the first coating position is kept dust-free.

7. A method comprising using a jet printing device to selectively coat a circuit carrier with a coating, wherein at least an upper side of a band-like structure has a plurality of periodically repeating component positions, each of which has a circuit carrier for a semiconductor component, being coated selectively, wherein an upper side and an underside of the periodically repeating component positions are coated selectively.

8. The method according to claim 7, wherein using a jet printing device comprises using at least one jet printer for the selective coating of the periodically repeating component positions, the jet printer having one or more electronically controllable jet heads, and wherein the method further comprises using a control unit to align the jet heads with the component positions to be coated.

9. The method according to claim 8, wherein the at least one jet printer comprises a plurality of jet printers, the plurality of jet printers each being controlled separately.

10. The method according to claim 7, further comprising using guide mechanism to guide a plurality of other band-like structures from a first coating position to a second coating position, an upper side of the periodically repeating component positions being coated selectively in the first coating position, and an underside of the periodically repeating component positions being coated selectively in the second coating position.

11. The method according to claim 7, wherein using the jet printing device comprises using the jet printing device to selectively coat the periodically repeating component positions with an adhesion-promoting layer or a corrosion prevention layer or an electrical insulating layer.

12. The method according to claim 11, further comprising jet-printing with the coating areas of the component positions which are subsequently to be embedded in or covered with a plastic compound.

13. A method for applying a coating to a circuit carrier, the method comprising:

providing a band-like structure, which has a plurality of periodically repeating component positions, each component position comprising a circuit carrier for a semiconductor component;

introducing the band-like structure to be coated into a first coating position;

performing simultaneous selective coating by means of a jet printing process on the repeating component positions on at least one upper side of the band-like structure with a coating; transporting the band-like structure to be coated into a second coating position;

performing simultaneous selective coating by means of a jet printing process of a plurality of periodically repeating component positions on an underside of the band-like structure with a coating; and moving the band-like structure selectively coated on both sides with the coating material out of the second coating position.

14. The method according to claim 13, wherein performing selective coating comprises selectively coating the periodically repeating component positions with a layer by an image recognition unit acquiring the arrangement of the component positions spatially and an image evaluation unit controlling the jet heads via a control unit in such a way that only those areas of the component positions which are subsequently to be embedded in or covered by a plastic compound are jet-printed with the coating.

15. The method according to claim 13, wherein performing selective coating comprising selectively coating the periodically repeating component positions with an adhesion-promoting layer or a corrosion prevention layer or an electrical insulating layer.

16. The method according to claim 13, further comprising transporting the coated band-like structure into an additional position and dried there.

17. The method according to claim 13, further comprising transporting the coated band-like structure into an additional position and cleaned there.

* * * * *